United States Patent
Tseng et al.

[19]

[11] Patent Number: 6,035,114
[45] Date of Patent: Mar. 7, 2000

[54] METHOD FOR CONSTRUCTING FAULT CLASSIFICATION TABLES OF ANALOG CIRCUITS

[75] Inventors: I-Shih Tseng, Taipei; Ying-Kun Tsao, Changhua Hsien; Shou-Chieh Chang, Ping Tung Hsien; Wei-Lung Mao, Keelung; Yi-Fan Chan, Taipei, all of Taiwan

[73] Assignee: Institute for Information Industry, Taipei, Taiwan

[21] Appl. No.: 08/906,087

[22] Filed: Aug. 5, 1997

[51] Int. Cl.[7] .................................................... G06F 19/00
[52] U.S. Cl. ................................ 395/500.34; 395/500.23
[58] Field of Search ......................... 395/500.23, 500.24, 395/500.34, 500.35

[56] References Cited

U.S. PATENT DOCUMENTS

| | | | |
|---|---|---|---|
| 5,099,436 | 3/1992 | McCown et al. | 702/82 |
| 5,511,162 | 4/1996 | Hamada et al. | 706/45 |
| 5,515,384 | 5/1996 | Horton, III | 714/733 |
| 5,544,308 | 8/1996 | Giordano et al. | 706/45 |

OTHER PUBLICATIONS

Sujoj Sen et al. "Simulation–Based Testability Analysis and Fault Diagnosis", IEEE, Sep. 1999.

*Primary Examiner*—Kevin J. Teska
*Assistant Examiner*—Kyle J. Choi
*Attorney, Agent, or Firm*—McDermott, Will & Emery

[57] ABSTRACT

The present invention discloses a method for constructing the fault classification tables of analog circuits, and the fault classification tables can be further applied to construct analog CAT tools. The constructing method uses the fault models but the normal models inserting in parts of the analog circuit components, and then utilizes a circuit simulator to obtain waveform from the defect analog circuit. Exclusive and non-exclusive classification schemes are applied to establish the failure modes of the defect analog circuit when the waveform is recorded as a fault dictionary. It is unnecessary to construct a real analog circuit as the conventional does.

8 Claims, 5 Drawing Sheets

|   | Normal | A | B |
|---|---|---|---|
| $\alpha$ | 10 | 10 | 1 |
| $\beta$ | 5 | 6 | 5 |
| $r$ | 2 | 15 | 7 |

FIG.1A

| Test Point | recignized fault modules |
|---|---|
| $\alpha$ | Normal and B |
| $\beta$ | Normal and A |
| $r$ | Normal ,A, and B |

FIG.1B

|   | A | B |
|---|---|---|
| $\alpha$ | × | ✓ |
| $\beta$ | ✓ | × |
| $r$ | ✓ | ✓ |

FIG.1C

| fault group Classification Scheme | fault group |
|---|---|
| Exclusive | (A) (B,C,D) |
| Non-Exclusive | (A) (C) (C,D) (B,C,D) (B) |

| Fault Group | Low-limit Voltage | High-limit Voltage |
|---|---|---|
| (A) | $V_6$ | $V_7$ |
| (B,C,D) | $V_1$ | $V_5$ |

FIG.6A

| Fault Group | Low-limit Voltage | High-limit Voltage |
|---|---|---|
| (B) | $V_1$ | $V_2$ |
| (B,C,D) | $V_2$ | $V_3$ |
| (C,D) | $V_3$ | $V_4$ |
| (C) | $V_4$ | $V_5$ |
| (A) | $V_6$ | $V_7$ |

FIG.6B

METHOD FOR CONSTRUCTING FAULT CLASSIFICATION TABLES OF ANALOG CIRCUITS

BACKGROUND OF THE INVENTION

1. Field of the Invention

The invention relates to a method for constructing the fault classification tables of analog circuits, and furthermore, to establish the testing tools of the analog circuits by using the functions of computer aided engineering. The constructing method uses failure modes in parts of the analog circuit components, and then applies a circuit simulator to obtain waveform from the defected analog circuit. Exclusive and nonexclusive classification schemes are applied to obtain accurate correspondences between the test data and the failure modes.

2. Description of the Prior Art

As electric technologies go on getting progresses, there are kinds of electric products coming into human's life. However, a great deal of control circuits such as digital and analog circuits are needed to control the operations of the electric products. Everyone should agree that the control circuits can be treated as the souls of the electric products. Therefore, the control circuits must pass many testing procedures before obtaining a required design.

An early testing scheme needs to actually implement the designed circuits after completing the circuit diagram, and perform the testing procedures to the actual circuit for detecting whether the designed circuit achieves the design purpose. When the detecting result is out of expect, the circuit designer must modify the circuit diagram and implement the modified circuit for testing again. The above testing procedure keeps going until the modified circuit achieves the designed requirement. However, this testing procedure wastes many circuit materials, and needs professional circuit engineers to perform this detecting routine. Clearly, it is not an efficient testing scheme.

In order to overcome the disadvantage of the conventional scheme, tools derived from computer aided engineering (CAE) is growing up. The CAE is a computer program established in a workstation or a personal computer. A circuit designer uses graphic icon to build a circuit diagram, and then performs a simulation procedure to the designed circuit by using a simulation package. The simulation package is composed of software modules, which compiles the designed circuit diagram and converts it into circuit modules with wires as connections. The simulation procedure inputs a pulse into the circuit modules, and then calculates the voltages (or current) estimations at each node of the circuit modules. Output waveform generated by the simulation procedure is displayed to the designer when the simulation procedure terminates. The designer can modify the circuit diagram and perform the simulation procedure until the designed circuit achieves his requirement. Of course, the CAE can significantly degrade the time for designing a circuit, and furthermore, can save many circuit materials that are unnecessarily wasted.

Computer aided testing (CAT) is a tool extending the applications of the CAE and simulation to the field of circuit testing. The CAT tools apply failure modes that insert the fault models but the normal models in parts of the circuit components (for example, a fault model simulates the characteristic of a diode acts when punch through appears), and then starts the simulation procedure to record the output waveform as a fault dictionary. Next time when the circuit is testing, the testing result can be compared with the fault dictionary to find the defect components.

In the present days, only the digital CAT tools have been completely developed. However, the characteristics of the analog circuit are quite different with the digital, and thus the analog CAT tools are deficient now. In the prior skills, such as the article "Simulation-based testability analysis and fault diagnosis" disclosed by Sujoy et al. in IEEE Transaction on Autotestcon on September 1996, only a simple classification scheme is suggested to the test points of the analog circuit.

For example, in the FIG. 1A, there are three test points $\alpha$, $\beta$, and $\gamma$, and two failure modes A and B in an analog circuit. In the failure mode B, the measured values (can be voltage or current) obtained from the $\alpha$, $\beta$, and $\gamma$ are 10, 5, and 2, respectively, under the normal condition. In the failure mode A, the measured values of the $\alpha$, $\beta$, and $\gamma$ are respective 10, 6, and 15. The measured values of the $\alpha$, $\beta$, and $\gamma$ are 1, 5, and 7, respectively, while under the failure mode B. However, different failure modes are represented by different fault models of the circuit components, which implies that the measured values will be different while the different failure modes are applied.

Referring to the FIG. 1A, by using the measured values of the $\alpha$ test point can be recognized the failure mode B from the normal condition but the failure mode A. The normal condition and the failure mode A can be distinguished from the measured values of the $\beta$ test point. From the measured values of the $\gamma$ test point, the normal condition, the failure mode A, and the failure mode B can be recognized. The above-mentioned conclusions are listed in FIG. 1B. The fault dictionary listed in FIG. 1C is derived from the method disclosed by Sujoy et al., which is generated based on the concept of "whether the measured values of the test points should be affected by a failure mode". For example, the failure mode A will change the measured values of the $\beta$ (from 5 to 6) and $\gamma$ (from 2 to 10) but the $\alpha$ test point (still keeps in 10). Thus, in the FIG. 1C, the relations between the failure mode A and the test points $\beta$ and $\gamma$ are labeled by '√', but the relation between the failure mode A and the test point $\alpha$ are labeled by a '×'. Next time when the analog circuit is tested, the fault dictionary of the FIG. 1C is used to detect whether the analog circuit is normal or not.

Unfortunately, each the testing value is not fixed but varies in a tolerance range that is caused by the environment around the circuit and the defects of the circuit components. For example, the testing value 10 may vary in the tolerance range (8.5, 11.5). However, a larger tolerance range will affect decisions to the measured values.

Furthermore, a fault decision may be done while there are many test points are applied, which will bring troubles to the fault dictionary generated by Sujoy et al. What is clearly needed is a method for constructing the reliable analog CAT tools as to overcome the disadvantages of the conventional skills.

SUMMARY OF THE INVENTION

The principal object of the invention is to provide a method for constructing fault classification tables for the analog circuit. The fault classification tables can be further applied to establish analog CAT tools for analog circuits.

The method for constructing the fault classification tables of the analog circuits uses failure modes that utilize the fault models but the normal models inserting in parts of the analog circuit components, and then applies a circuit simulator MicroSim PSPICE to generate waveform. Furthermore, a Monte-Carlo model is applied in the generated waveform to assign the tolerance used by the fault tables. Finally, the fault classification tables are classified by an exclusive or a non-exclusive scheme to obtain an accurate correspondence between the measured values and the failure modes.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1A represents a table listing the measured values of an analog circuit with three test points and two failure modes;

FIG. 1B describes a table listing the recognized failure modes that the three test points can recognize in the FIG. 1A;

FIG. 1C is a fault dictionary generated by the method disclosed by Sujoy et al.;

FIG. 6A represents the low-limit and high-limit voltages of the fault groups derived from the FIG. 4 by using the exclusive scheme; and FIG. 6B illustrates the low-limit and high-limit voltages of the fault groups derived from the FIG. 4 by using the non-exclusive scheme.

DESCRIPTION OF THE PREFERRED EMBODIMENT

Figures 4, 5:
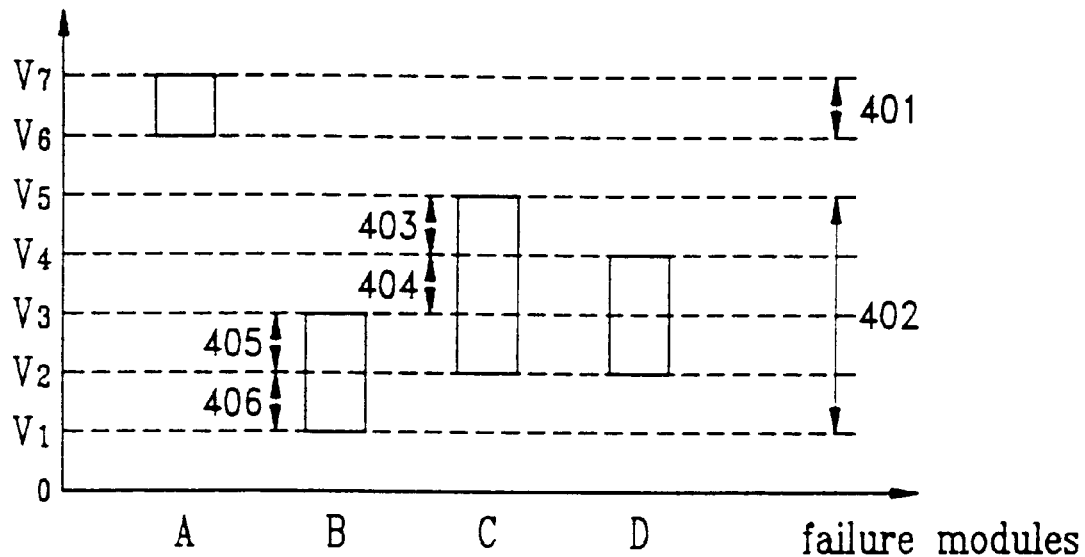
FIG. 4 describes a distribution diagram of an analog circuit with four failure modes in a test point.
FIG. 5 is a table for representing the fault groups of the analog circuit in the FIG. 4 by using the exclusive and the non-exclusive schemes according to the invention.

FIG. 4 describes a distribution diagram of an analog circuit with four failure modes A, B, C, and D in a test point. The distribution diagram is generated by the MicroSim PSPICE simulator, and assigns the tolerance range according to Monte-Carlo model. In the preferred embodiment of the invention, the distribution diagram of the FIG. 4 will be an example for establishing the fault tables.

Referring to the FIG. 4, when a testing voltage falls in the range 401 between $V_6$ and $V_7$, it indicates that the fault condition is caused by the failure mode A. When the testing voltage fails in the range 403 between $V_4$ and $V_5$, it indicates that the fault condition is caused by the failure mode C. If the testing voltage failure in the range 406 between $V_1$ and $V_2$, it implies that the fall condition is caused by the failure mode B. It is impossible to recognize that the fault condition is caused by the failure mode C or D when the test voltage falls in the range 404 between $V_3$ and $V_4$. Similarly, it is also impossible to recognize that the fault condition is caused by the failure mode B, C, or D without further testing information when the testing voltage falls in the range 405 between $V_2$ and $V_3$.

Because the tolerance range will significantly influence the fault classification tables, it is necessary to choose a proper tolerance assigned scheme. There are many schemes for assigning the tolerance ranges, such as applies percentages of a testing value (e.g., ±5% or ±10% of the testing voltage), or a variation range based on the testing value (e.g., the range varies from (testing voltage +0.5 volt) to (testing voltage −0.5 volt)), or by applying the Monte-Carlo model to assign the tolerance ranges. Each the tolerance range is set by using the Monte-Carlo model in the preferred embodiment.

Figure 2:
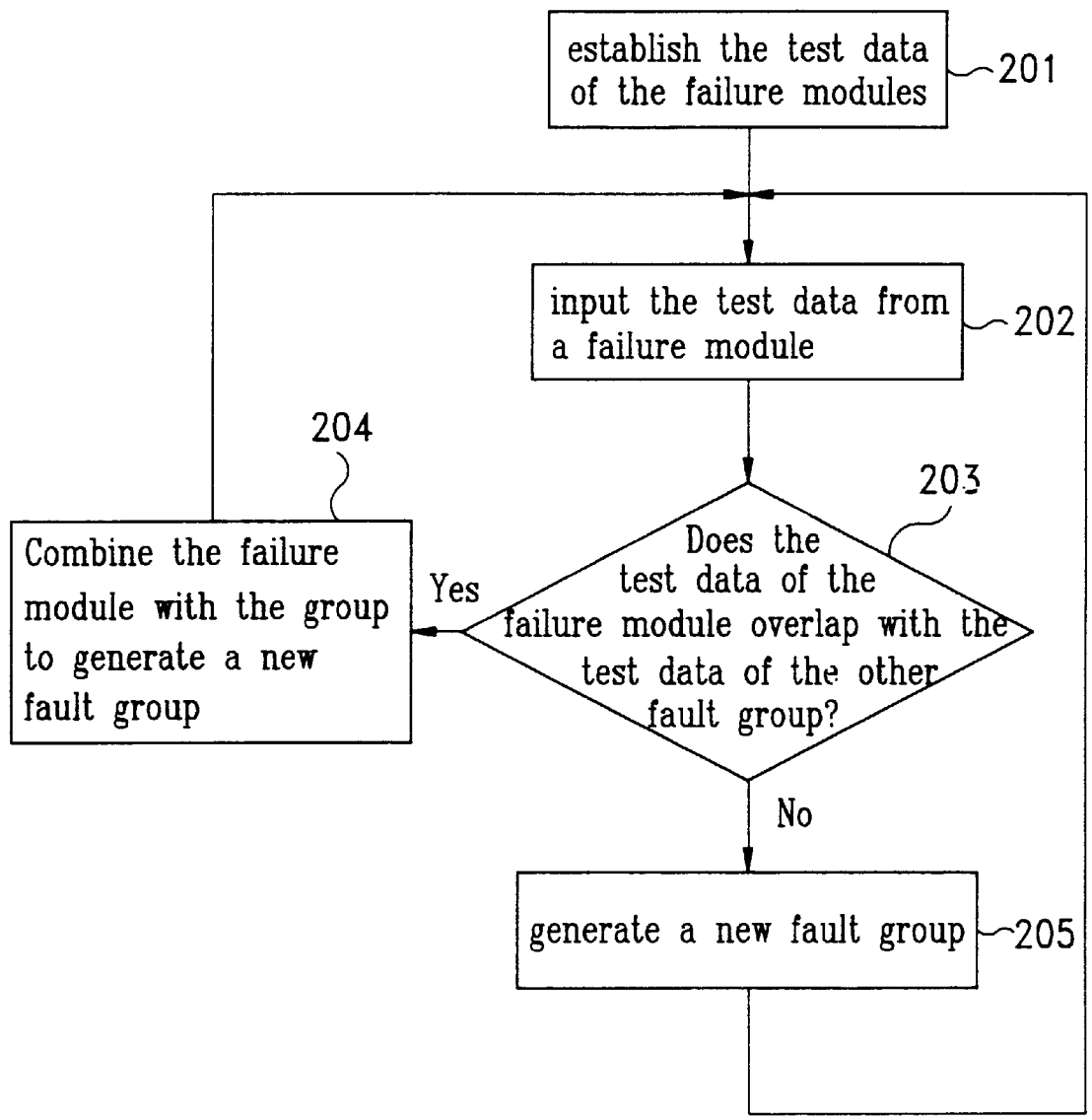
FIG. 2 illustrates a flow chart representing the operations of generating a fault classification table by applying the exclusive scheme according to the invention.

FIG. 2 illustrates a flow chart representing the operations of generating the fault classification table by applying the exclusive scheme. The test data of the failure modes are generated by the simulator, at first (step 201). The fault classification table is then established by inputting the test data from one failure mode at a time (step 202). When the test data of the failure mode does not overlap with the test data of other fault groups, a new fault group is established by using the failure mode (step 203 and 205). When the test data of the failure mode overlaps with the test data of the other fault groups, then combine the failure mode with the overlapped fault group (step 203 and 204).

The distribution diagram of the FIG. 4 is given as example for further explanations, and assumes that the inputting sequence follows 'A, B, C, and D'. Because the failure mode A is the first input failure mode, it will not overlap with any fault group (there is no fault group now), and a fault group {(A)} will be created in step 204. Next, the test data of the failure mode B does not overlap with the test data of the fault group {(A)} when the failure mode B is input, a new fault group {(B)} is established in the step 204. Now, the fault classification table contains two fault groups {(A), (B)}. When the failure mode C inputs, it is obvious that the test data of the failure mode C partially overlaps with the test data of the fault group {(B)}. The failure mode C will be combined with the fault group {(B)} to generate new fault group {(B, C)}. Thus, the fault classification table contains two fault groups {(A), (B, C)}. Finally, the test data of the failure mode D overlaps with the test data of the fault group {(B, C)}, the failure mode D is combined with the fault group {(B, C)} to generate a new fault group {(B, C, D)}.

FIG. 6A represents the lowest and high-limit voltages of the fault groups derived from the FIG. 4 by using the exclusive scheme. Clearly, the low-limit voltage and the high-limit voltage of the fault group {(A)} are $V_6$ and $V_7$ (i.e., the range 401), respectively. The low-limit voltage and the high-limit voltage of the fault group {(B, C, D)} are $V_1$ and $V_5$ (i.e., the range 402), respectively.

Figure 3:
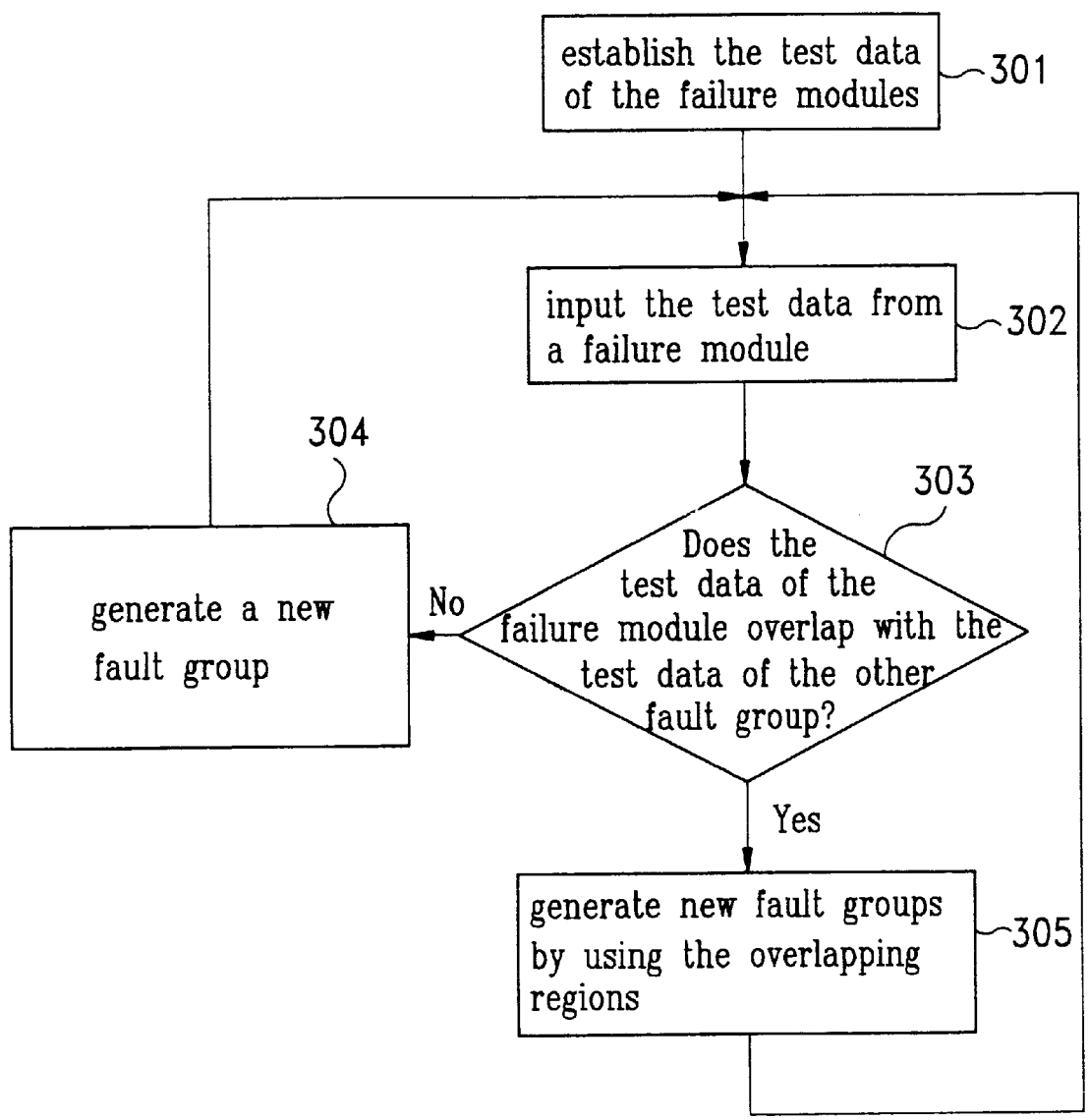
FIG. 3 represents a flow chart describing the operations of generating a fault classification table by applying the non-exclusive scheme according to the invention.

FIG. 3 represents a flow chart describing the operation of generating the fault classification table by applying the non-exclusive scheme. The test data of the failure modes are also generated by the simulator (step 301). The fault classification table is then construct by inputting the test data from one failure mode at a time (step 302). When the test data of the failure mode does not overlap with the test data of other fault groups, a new fault group is created by using the failure mode (step 303 and 304). Otherwise, when the test data of the failure mode overlaps with the test data of the other fault groups, then generates new fault groups according to the overlapped regions (step 303 and 305).

By applying the distribution diagram of the FIG. 4 as example for further explanations, and assume that the inputting sequence also follows 'A, B, C, and D'. Because the failure mode A is the first input failure mode, it will not overlap with any fault group, and a fault group {(A)} will be created in step 304. Next, the test data of the failure mode B does not overlap with the test data of the fault group {(A)} when the failure mode B is input, a new fault group {(B)} is established in the step 304. Now, the fault classification table contains two fault groups {(A), (B)}. When the failure mode C inputs, it is clearly that the test data of the failure mode C partially overlaps with the test data of the fault group {(B)}, and a new fault group {(B, C)} is generated. The original fault group {(B)} is modified to include only the non-overlapped part, and fault group {{C}} also includes only parts of not overlapped with failure B and C. Thus, the fault classification table contains four fault groups {(A), (B), (C), (B, C)}. Because the test data of the failure mode D overlaps with the test data of the fault groups {(C)} and {(B, C)}, new fault groups {(C, D)} and {(B, C, D)} are also generated. Finally, the fault classification table contains five fault groups {(A), (B), (C), (C, D), (B, C, D)}.

FIG. 6B represents the lowest and high-limit voltages of the fault groups derived from the FIG. 4 by using the exclusive scheme. Clearly, the low-limit voltage and the high-limit voltage of the fault group {(B)} are $V_1$ and $V_2$ (i.e., the range 406), respectively. The low-limit voltage and the high-limit voltage of the fault group {(B, C, D)} are $V_2$ and $V_3$ (i.e., the range 405), respectively. The low-limit voltage and the high-limit voltage of the fault group {(C, D)} are $V_3$ and $V_4$ (i.e., the range 404), respectively. The low-limit voltage and the high-limit voltage of the fault group {(C)} are $V_4$ and $V_5$ (i.e., the range 403), respectively. The low-limit voltage and the high-limit voltage of the fault group {(A)} are $V_6$ and $V_7$ (i.e., the range 401), respectively.

FIG. 5 summaries the fault classification table obtained by the exclusive (algorithm described in the FIG. 2) and non-exclusive schemes (algorithm described in the FIG. 3). Each failure mode of the fault groups will not be included in other fault groups while the exclusive scheme is applied. For example, the ranges 401 and 402 are exclusive, which respectively include fault groups {(A)} and {(B, C, D)}. In contrast to the exclusive scheme, the non-exclusive scheme divided the test data of a failure mode into several sub-regions while the test data overlaps with others, and each the failure mode may be included in many fault groups. For example, the fault condition may be caused by the failure mode C or D when the test data falls in the range 404, and the fault classification table contains five fault groups {(A), (B), (C), (C, D), (B, C, D)} when the non-exclusive scheme is applied.

Each the test point of the analog circuit can generate a fault classification table by using the schemes mentioned above. A further procedure is necessary to process these fault classification tables for establishing analog CAT tools. For example, construction of a decision tree or a neuro module can be applied to establish the analog CAT tools. In addition, each the above-mentioned test data point may contain more than one measured data. For example, the test data may contains measured voltage and measured current. It has no constraint in constructing the correspondence between the test data and the failure modes only by applying one kind of measured data.

In conclusion, the invention discloses a method for constructing the fault classification tables of analog circuits. The fault tables can be further applied to establish analog CAT tools. The constructing method uses the failure modes that apply the fault models but the normal models inserting in parts of the analog circuit components, and then applies a circuit simulator to generate waveform from the defect analog circuit. Exclusive and non-exclusive classification schemes are applied to the fault classification tables to obtain accurate correspondences between the test data and the failure modes.

As is understood by a person skilled in the art, the foregoing preferred embodiments of the present invention are illustrated of the present invention rather than limiting of the present invention. It is intended to cover various modifications and similar arrangements included within the spirit and scope of the appended claim the scope of which should be accorded the broadest interpretation so as to encompass all such modifications and similar structure.

What is claimed is:

1. A method for constructing fault classification tables of analog circuits, said fault classification tables comprises a plurality of fault groups that are established by a plurality of failure modes, wherein said constructing method comprises the steps of:

constructing test data of said plurality of failure modes;

inputting said test data from said failure mode;

establishing a new fault group by using said failure mode when said test data of said failure mode does not overlap with any test data of said established fault groups; and combining said failure mode with an overlapped established fault group to generate a new fault group when said test data of said failure mode overlaps with said test data of said overlapped established fault groups.

2. The constructing method according to claim 1, wherein said step of constructing said test data of said plurality of failure modes comprises a step of assigning tolerance ranges of said test data by using a Monte-Carlo model.

3. The constructing method according to claim 1, wherein each said failure mode of said fault group is not included by another said fault groups.

4. The constructing method according to claim 1, wherein said failure modes are generated by inserting fault models of circuit components in parts of said analog circuit.

5. A method for constructing fault classification tables of analog circuits, said fault classification tables comprises a plurality of fault groups that are established by a plurality of failure modes, wherein said constructing method comprises the steps of:

constructing test data of said plurality of failure modes;

inputting said test data from said failure mode;

establishing a new fault group by using said failure mode when said test data of said failure mode does not overlap with any test data of said established fault groups; and generating a new fault group by using said failure mode and an overlapped established fault group when said test data of said failure mode overlaps with said test data of said overlapped established fault groups.

6. The constructing method according to claim 5, wherein said step of constructing said test data of said plurality of failure modes comprises a step of assigning tolerance ranges of said test data by using a Monte-Carlo model.

7. The constructing method according to claim 5, wherein each said failure mode of said fault group can be included by another said fault groups.

8. The constructing method according to claim 5, wherein said failure modes are generated by inserting fault models of circuit components in parts of said analog circuit.

* * * * *